United States Patent
Hu et al.

(10) Patent No.: US 11,482,583 B2
(45) Date of Patent: Oct. 25, 2022

(54) DISPLAY APPARATUS, COUNTER SUBSTRATE OF DISPLAY APPARATUS, METHOD OF FABRICATING DISPLAY APPARATUS

(71) Applicants: BEIJING BOE DISPLAY TECHNOLOGY CO., LTD., Beijing (CN); BOE Technology Group Co., Ltd., Beijing (CN)

(72) Inventors: Weipin Hu, Beijing (CN); Lianjie Qu, Beijing (CN); Qianqian Bu, Beijing (CN); Xiao Sun, Beijing (CN)

(73) Assignees: BEIJING BOE DISPLAY TECHNOLOGY CO., LTD., Beijing (CN); Beijing BOE Technology Development Co., Ltd., Beijing (CN)

(*) Notice: Subject to any disclaimer, the term of this patent is extended or adjusted under 35 U.S.C. 154(b) by 317 days.

(21) Appl. No.: 16/626,306

(22) PCT Filed: Jun. 18, 2019

(86) PCT No.: PCT/CN2019/091736
§ 371 (c)(1),
(2) Date: Dec. 23, 2019

(87) PCT Pub. No.: WO2020/151171
PCT Pub. Date: Jul. 30, 2020

(65) Prior Publication Data
US 2021/0359062 A1    Nov. 18, 2021

(30) Foreign Application Priority Data
Jan. 25, 2019    (CN) .......................... 201910075055.1

(51) Int. Cl.
H01L 27/32    (2006.01)
H01L 51/52    (2006.01)
H01L 51/56    (2006.01)

(52) U.S. Cl.
CPC ...... *H01L 27/3269* (2013.01); *H01L 27/3253* (2013.01); *H01L 51/5284* (2013.01); *H01L 51/56* (2013.01); *H01L 2227/323* (2013.01)

(58) Field of Classification Search
None
See application file for complete search history.

(56) References Cited

U.S. PATENT DOCUMENTS

2006/0030084 A1* 2/2006 Young ................. H01L 27/1214
                                                                      438/149
2007/0257254 A1    11/2007 Yang et al.
(Continued)

FOREIGN PATENT DOCUMENTS

CN    101221962 A    7/2008
CN    104375275 A    2/2015
(Continued)

OTHER PUBLICATIONS

International Search Report & Written Opinion dated Oct. 29, 2019, regarding PCT/CN2019/091736.
(Continued)

*Primary Examiner* — Khaja Ahmad
(74) *Attorney, Agent, or Firm* — Intellectual Valley Law, P.C.

(57) ABSTRACT

A display apparatus having a plurality of subpixels is provided. The display apparatus includes an array substrate and a counter substrate facing the array substrate. The counter substrate includes a base substrate; an optical compensation device on the base substrate configured to adjust light emitting brightness values of the plurality of subpixels
(Continued)

to target brightness values respectively; and a plurality of light shielding walls on the base substrate. The optical compensation device include a plurality of photosensors configured to respectively detect light emitting brightness values of the plurality of subpixels. A respective one of the plurality of light shielding walls is configured to at least partially shield a lateral side of a respective one of the plurality of photosensors from light emitted from adjacent subpixels.

18 Claims, 7 Drawing Sheets

(56) References Cited

U.S. PATENT DOCUMENTS

| | | | | |
|---|---|---|---|---|
| 2015/0108508 A1* | 4/2015 | Wu | ...................... | H01L 27/3227 |
| | | | | 257/84 |
| 2016/0269658 A1* | 9/2016 | Choi | .................. | H04N 5/35563 |
| 2017/0012086 A1* | 1/2017 | Kim | ...................... | H01L 51/5271 |
| 2017/0179092 A1* | 6/2017 | Sasaki | ................... | H01L 25/167 |
| 2017/0278909 A1 | 9/2017 | Jeon et al. | | |
| 2018/0217430 A1 | 8/2018 | Ding et al. | | |
| 2019/0099096 A1 | 4/2019 | Wang et al. | | |
| 2019/0214448 A1 | 7/2019 | Hu et al. | | |
| 2019/0296055 A1* | 9/2019 | Lius | ..................... | H01L 27/124 |
| 2019/0371870 A1* | 12/2019 | Wang | .................. | G06K 9/0004 |
| 2021/0202620 A1* | 7/2021 | Feng | ................... | H01L 27/3258 |

FOREIGN PATENT DOCUMENTS

| | | | | | |
|---|---|---|---|---|---|
| CN | 105975136 A | | 9/2016 | | |
| CN | 106684202 A | | 5/2017 | | |
| CN | 107068716 A | * | 8/2017 | ......... | H01L 27/3234 |
| CN | 107492317 A | | 12/2017 | | |
| CN | 108230997 A | | 6/2018 | | |
| CN | 108615746 A | | 10/2018 | | |
| CN | 108735786 A | | 11/2018 | | |
| CN | 108807719 A | | 11/2018 | | |
| CN | 108878503 A | | 11/2018 | | |
| CN | 109065582 A | | 12/2018 | | |

OTHER PUBLICATIONS

First Office Action in the Chinese Patent Application No. 201910075055.1, dated Apr. 26, 2020; English translation attached.

* cited by examiner

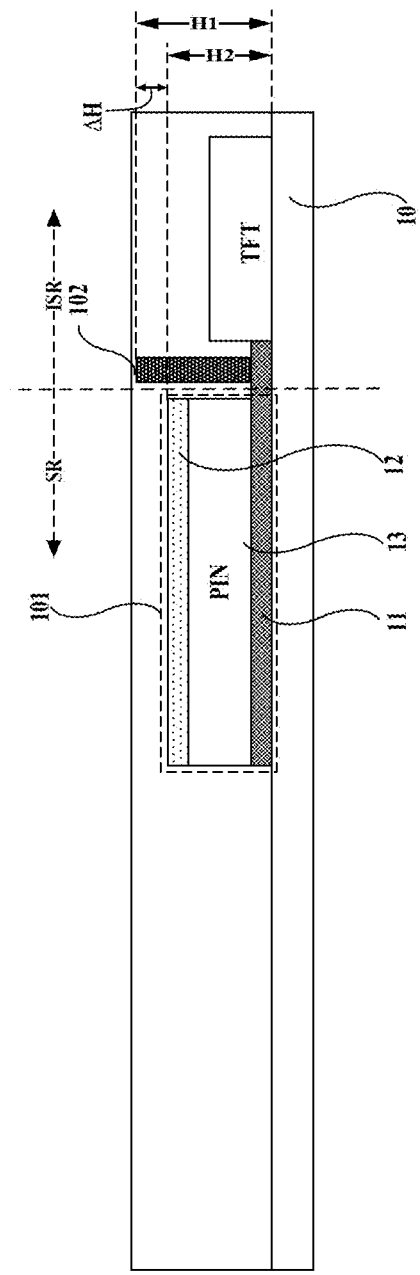
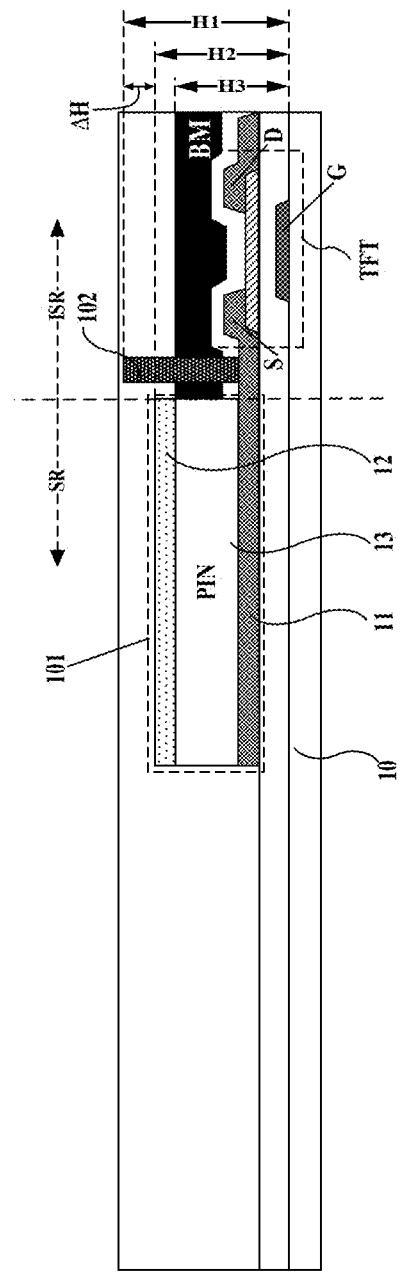
FIG. 2A
FIG. 2B

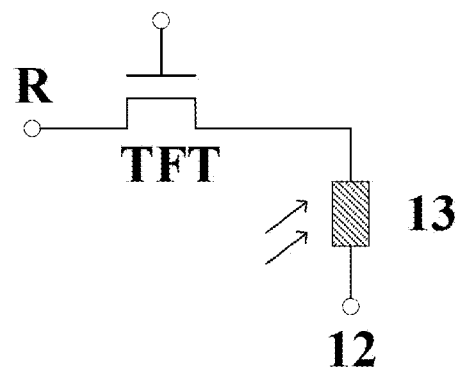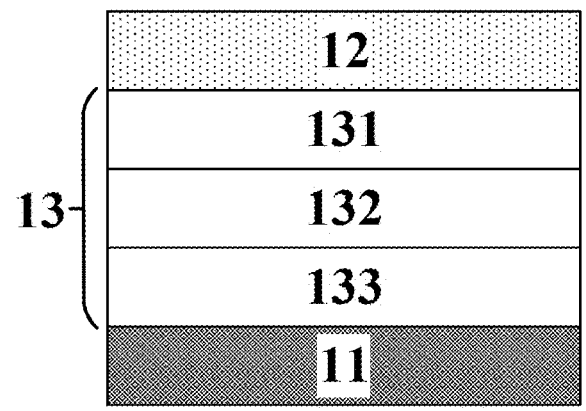
FIG. 3A            FIG. 3B
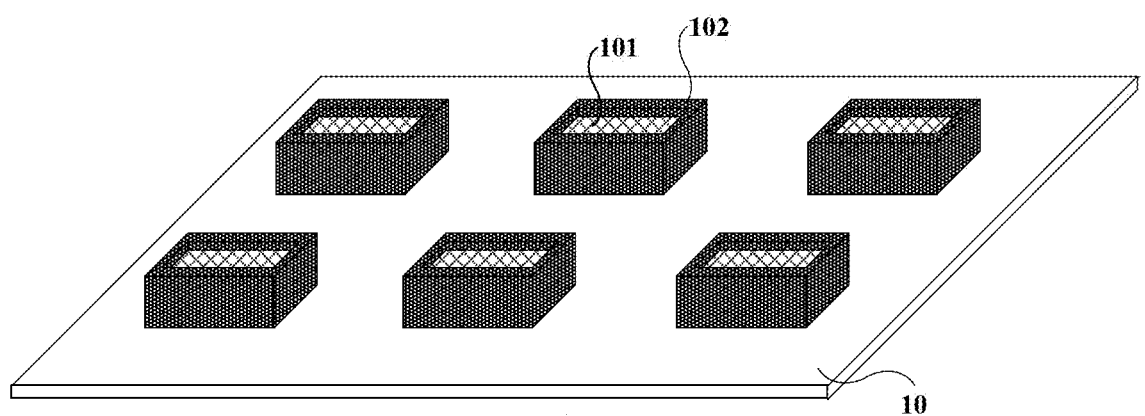
FIG. 4

DISPLAY APPARATUS, COUNTER SUBSTRATE OF DISPLAY APPARATUS, METHOD OF FABRICATING DISPLAY APPARATUS

CROSS-REFERENCE TO RELATED APPLICATION

This application is a national stage application under 35 U.S.C. § 371 of International Application No. PCT/CN2019/091736, filed Jun. 18, 2019, which claims priority to Chinese Patent Application No. 201910075055.1, filed Jan. 25, 2019. Each of the forgoing applications is herein incorporated by reference in its entirety for all purposes.

TECHNICAL FIELD

The present invention relates to display technology, more particularly, to a display apparatus, a counter substrate of a display apparatus, a method of fabricating a display apparatus.

BACKGROUND

In present, the organic light emitting diode (OLED) display apparatus attracts more and more attention, because the OLED display apparatus has many advantages including self-illumination, rich colors, fast reaction speed, wide viewing angle, high contrast ratio, low power consumption, lightness and thinness, and good flexibility.

When a subpixel of the OLED display apparatus display images having high contrast ratio or high brightness for a long time, the brightness of light emitted from the subpixel is reduced. When the brightness of light emitted from some of subpixels is reduced, the whole OLED display panel will not have a uniformity of brightness. By disposing photosensors to detect brightness of each one of subpixels in the OLED display apparatus, the OLED display panel can adjust brightness of light emitted from each one of subpixels and compensate the brightness of light as needed.

SUMMARY

In one aspect, the present invention provides a display apparatus having a plurality of subpixels, comprising an array substrate and a counter substrate facing the array substrate; wherein the counter substrate comprises a base substrate; an optical compensation device on the base substrate configured to adjust light emitting brightness values of the plurality of subpixels to target brightness values respectively, the optical compensation device comprising a plurality of photosensors configured to respectively detect light emitting brightness values of the plurality of subpixels; and a plurality of light shielding walls on the base substrate; wherein a respective one of the plurality of light shielding walls is configured to at least partially shield a lateral side of a respective one of the plurality of photosensors from light emitted from adjacent subpixels.

Optionally, a respective one of the plurality of photosensors comprises a first electrode on the base substrate; a light detecting unit on a side of the first electrode away from the base substrate; and a second electrode, which is substantially transparent, on a side of the light detecting unit away from the first electrode; wherein the respective one of the plurality of light shielding walls is configured to at least partially shield a lateral side of the light detecting unit of the respective one of the plurality of photosensors from light emitted from the adjacent subpixels; and a side of the respective one of the plurality of light shielding walls closer to the base substrate is in direct contact with the first electrode of the respective one of the plurality of photosensors.

Optionally, the counter substrate further comprises a plurality of thin film transistors on the base substrate and respectively in the plurality of subpixels; a respective one of the plurality of thin film transistors comprises a source electrode; and the first electrode is electrically connected to the source electrode.

Optionally, the first electrode and the source electrode are parts of a unitary electrode; and the side of the respective one of the plurality of light shielding walls closer to the base substrate is in direct contact with the unitary electrode.

Optionally, a relative height of a side of the respective one of the plurality of light shielding walls away from the base substrate with respect to the base substrate is greater than a relative height of a side of the second electrode of the respective one of the plurality of photosensors away from the base substrate with respect to the base substrate.

Optionally, a relative height of the side of the respective one of the plurality of light shielding walls away from the base substrate with respect to the side of the second electrode of the respective one of the plurality of photosensors away from the base substrate is in a range of 2 µm to 20 µm.

Optionally, the array substrate comprises a plurality of light emitting elements respectively in the plurality of subpixels; an orthographic projection of the respective one of the light emitting elements on the counter substrate covers an orthographic projection of the respective one of the plurality of photosensors on the counter substrate; and the side of the second electrode of the respective one of the plurality of photosensors away from the base substrate is facing the respective one of the plurality of light emitting elements.

Optionally, the plurality of light shielding walls comprises a metal material; and a respective one of the plurality of light shieling walls is configured to reflect light emitted from a respective one of the subpixels to the respective one of the plurality of photosensors.

Optionally, the plurality of light shielding walls comprises a black resin material.

Optionally, the respective one of the plurality of light shielding walls substantially surrounds an area in the counter substrate corresponding to a respective one of the plurality of subpixels.

Optionally, the respective one of the plurality of light shielding walls substantially surrounds a perimeter of the light detecting unit of the respective one of the plurality of photosensors.

Optionally, the light detecting unit of the respective one of the plurality of photosensors is a PIN photodiode.

Optionally, the respective one of the plurality of light shielding walls is configured to completely shield the lateral side of the respective one of the plurality of photosensors from light emitted from adjacent subpixels.

In another aspect, the present invention provides a counter substrate of a display apparatus having a plurality of subpixels, comprising a base substrate; a plurality of photosensors on the base substrate configured to respectively detect light emitting brightness values of the plurality of subpixels; and a plurality of light shielding walls on the base substrate; wherein a respective one of the plurality of light shielding walls is configured to at least partially shield a lateral side of a respective one of the plurality of photosensors from light emitted from adjacent subpixels.

Optionally, a respective one of the plurality of photosensors comprises a first electrode on the base substrate; a light detecting unit on a side of the first electrode away from the base substrate; and a second electrode, which is substantially transparent, on a side of the light detecting unit away from the first electrode; wherein the respective one of the plurality of light shielding walls is configured to at least partially shield a lateral side of the light detecting unit of the respective one of the plurality of photosensors from light emitted from the adjacent subpixels; and a side of the respective one of the plurality of light shielding walls closer to the base substrate is in direct contact with the first electrode of the respective one of the plurality of photosensors.

Optionally, the counter substrate further comprises a plurality of thin film transistors on the base substrate and respectively in the plurality of subpixels; a respective one of the plurality of thin film transistors comprises a source electrode; and the first electrode is electrically connected to the source electrode.

Optionally, the first electrode and the source electrode are parts of a unitary electrode; and the side of the respective one of the plurality of light shielding walls closer to the base substrate is in direct contact with the unitary electrode.

Optionally, a relative height of a side of the respective one of the plurality of light shielding walls away from the base substrate with respect to the base substrate is greater than a relative height of a side of the second electrode of the respective one of the plurality of photosensors away from the base substrate with respect to the base substrate.

Optionally, a relative height of the side of the respective one of the plurality of light shielding walls away from the base substrate with respect to the side of the second electrode of the respective one of the plurality of photosensors away from the base substrate is in a range of 2 µm to 20 µm.

Optionally, the plurality of light shielding walls comprises a metal material; and a respective one of the plurality of light shieling walls is configured to reflect light emitted from a respective one of the subpixels to the respective one of the plurality of photosensors.

Optionally, the plurality of light shielding walls comprises a black resin material.

Optionally, the respective one of the plurality of light shielding walls substantially surrounds an area in the counter substrate corresponding to a respective one of the plurality of subpixels.

Optionally, the respective one of the plurality of light shielding walls substantially surrounds a perimeter of the light detecting unit of the respective one of the plurality of photosensors.

Optionally, the light detecting unit of the respective one of the plurality of photosensors is a PIN photodiode.

In another aspect, the present invention provides a method of fabricating a display apparatus having a plurality of subpixels, comprising forming an optical compensation device on a base substrate; forming a plurality of light shielding walls on the base substrate, thereby obtaining a counter substrate; and assembling the counter substrate and an array substrate together; wherein the optical compensation device is formed to comprises a plurality of photosensors configured to respectively detect light emitting brightness values of the plurality of subpixels; and a respective one of the plurality of light shielding walls configured to at least partially shield a lateral side of a respective one of the plurality of photosensors from light emitted from adjacent subpixels.

Optionally, forming a respective one of the plurality of light shielding walls comprises forming a first electrode of the respective one of the plurality of photosensors on the base substrate; forming a photoresist layer on a side of the first electrode of the respective one of the plurality of photosensors away from the base substrate; patterning the photoresist layer to form a via extending through the photoresist layer, forming the respective one of the plurality of light shielding walls in the via using an electroforming process; and removing the photoresist layer.

BRIEF DESCRIPTION OF THE FIGURES

The following drawings are merely examples for illustrative purposes according to various disclosed embodiments and are not intended to limit the scope of the present invention.

FIG. 2A is a zoom-in view of a partial structure of a counter substrate in some embodiments according to the present disclosure.

FIG. 2B is a zoom-in view of a partial structure of a counter substrate in some embodiments according to the present disclosure.

FIG. 3A is a circuit diagram of a respective one of the plurality of photosensors in some embodiments according to the present disclosure.

FIG. 3B is a schematic diagram illustrating the structure of a respective one of the plurality of photosensors in some embodiments according to the present disclosure.

FIG. 4 is a schematic diagram of a structure of a counter substrate in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the process of detecting brightness of light emitted from a subpixel using a photosensor, light emitted from adjacent subpixels may affect the detecting result of the photosensor, resulting in an inaccurate brightness compensation, which will not solve the problem of the nonuniformity of brightness of the whole OLED display panel.

Accordingly, the present disclosure provides, inter alia, a display apparatus, a counter substrate of a display apparatus, a method of fabricating a display apparatus that substantially obviate one or more of the problems due to limitations and disadvantages of the related art. In one aspect, the present disclosure provides a display apparatus having a plurality of subpixels. In some embodiments, the display apparatus includes an array substrate and a counter substrate facing the array substrate. Optionally, the counter substrate includes a base substrate; and an optical compensation device on the base substrate configured to adjust light emitting brightness values of the plurality of subpixels to target brightness values respectively, the optical compensation device including a plurality of photosensors configured to respectively detect light emitting brightness values of the plurality of subpixels; and a plurality of light shielding walls on the base substrate. Optionally, a respective one of the plurality of light shielding walls is configured to at least partially shield a lateral side of a respective one of the plurality of photosensors from light emitted from adjacent subpixels.

Figure 1A:
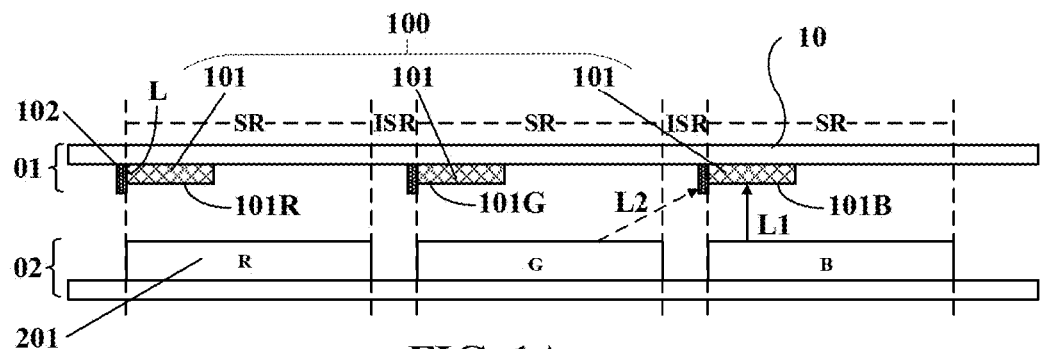
FIG. 1A is a schematic diagram of a structure of a display apparatus in some embodiments according to the present disclosure.
Figure 1B:
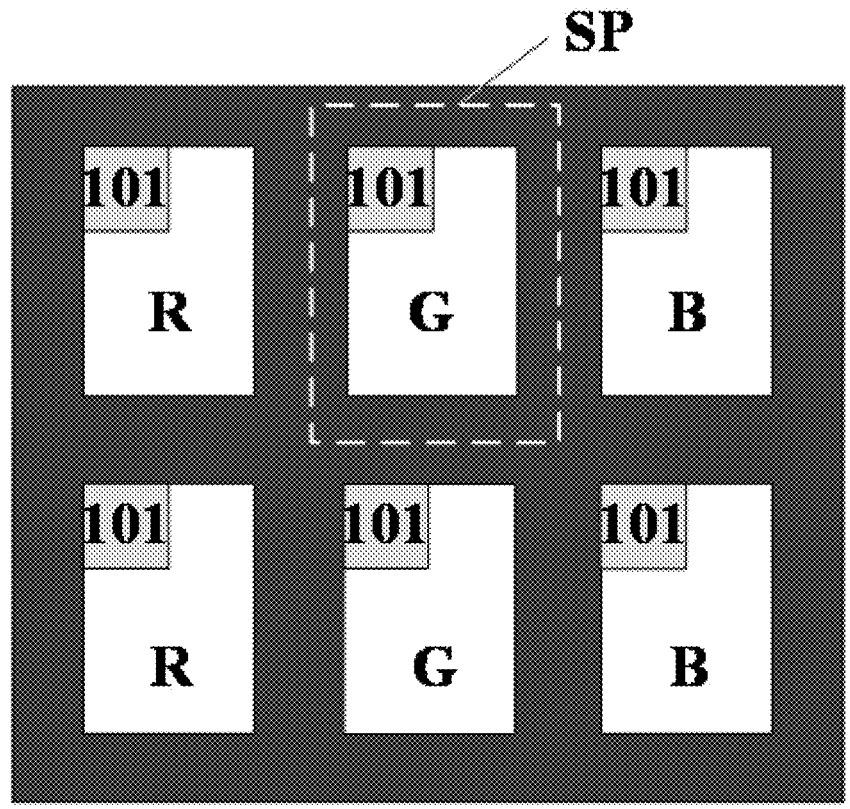
FIG. 1B is a plan view of a structure of a plurality of subpixels in a display apparatus in some embodiments according to the present disclosure.

FIG. 1A is a schematic diagram of a structure of a display apparatus in some embodiments according to the present disclosure. FIG. 1B is a plan view of a structure of a plurality of subpixels in a display apparatus in some embodiments according to the present disclosure. Referring to FIG. 1A and FIG. 1B, in some embodiments, the display apparatus has a plurality of subpixels SP. Optionally, the display apparatus has a plurality of subpixel regions SR and an inter-subpixel region ISR. In some embodiments, the display apparatus includes an array substrate 02 and a counter substrate 01 facing the array substrate 02.

As used herein, the term "subpixel region" refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, the term "inter-subpixel region" refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, referring to FIG. 1A, the counter substrate 01 includes a base substrate 10; an optical compensation device 100 on the base substrate 10 configured to adjust light emitting brightness values of the plurality of subpixels SP to target brightness values respectively; and a plurality of light shielding walls 102 on the base substrate 10. Optionally, the optical compensation device 100 includes a plurality of photosensors 101 configured to respectively detect light emitting brightness values of the plurality of subpixels SP. Optionally, the plurality of light shielding walls 102 is in the inter-subpixel region ISR. Optionally, a respective one of the plurality of light shielding walls 102 is configured to at least partially shield a lateral side L of a respective one of the plurality of photosensors 101 from light emitted from adjacent subpixels. For example, the respective one of the plurality of light shielding walls 102 is on a lateral side of the respective one of the plurality of photosensor 101. Optionally, the respective one of the plurality of light shielding walls is configured to substantially shield the lateral side of the respective one of the plurality of photosensors from light emitted from adjacent subpixels. Optionally, the respective one of the plurality of light shielding walls is configured to completely shield the lateral side of the respective one of the plurality of photosensors from light emitted from adjacent subpixels. Optionally, the respective one of the plurality of light shielding walls is configured to substantially shield all lateral sides of a respective one of the plurality of photosensors from light emitted from adjacent subpixels. Optionally, the respective one of the plurality of light shielding walls is configured to completely shield all lateral sides of a respective one of the plurality of photosensors from light emitted from adjacent subpixels.

FIG. 2A is a zoom-in view of a partial structure of a counter substrate in some embodiments according to the present disclosure. FIG. 2B is a zoom-in view of a partial structure of a counter substrate in some embodiments according to the present disclosure. Referring to FIG. 2A and FIG. 2B, in some embodiments, a respective one of the plurality of photosensors 101 includes a first electrode 11 on the base substrate 10; a light detecting unit 13 on a side of the first electrode 11 away from the base substrate 10; and a second electrode 12, which is substantially transparent, on a side of the light detecting unit 13 away from the first electrode 11.

As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

Optionally, the respective one of the plurality of light shielding walls 102 is configured to at least partially shield a lateral side of the light detecting unit 13 of the respective one of the plurality of photosensors 101 from light emitted from the adjacent subpixels. For example, the respective one of the plurality of light shielding walls 102 is on a lateral side of the light detecting unit 13 of the respective one of the plurality of photosensors 101.

Optionally, a side of the respective one of the plurality of light shielding walls 102 closer to the base substrate 10 is in direct contact with the first electrode 11 of the respective one of the plurality of photosensors 101.

Various materials may be used for making the first electrode 11. Examples of materials suitable for making the first electrode 11 include, but are not limited to, transparent conductive materials and non-transparent conductive materials. Optionally, the transparent conductive materials include indium tin oxide (ITO), indium gallium zinc oxide (IGZO), and indium zinc oxide (IZO). Optionally, the non-transparent conductive materials include conductive metal materials. For example, the first electrode 11 is a non-transparent electrode made of conductive metal materials.

Various materials may be used for making the second electrode 12. Examples of materials suitable for making the plurality second electrode 12 include, but are not limited to, transparent conductive materials. Optionally, the transparent conductive materials includes indium tin oxide (ITO), indium gallium zinc oxide (IGZO), and indium zinc oxide (IZO).

In some embodiments, referring to FIG. 1A, FIG. 2A, and FIG. 2B, the counter substrate 01 further includes a plurality of thin film transistors TFT on the base substrate 10 and respectively in the plurality of subpixels SP. Optionally, a respective one of the plurality of thin film transistors TFT includes a source electrode S, a drain electrode D, and a gate electrode G. Optionally, the first electrode 11 is electrically connected to the source electrode S.

Optionally, the first electrode 11 and the source electrode S are parts of a unitary electrode. Optionally, the side of the respective one of the plurality of light shielding walls 102 closer to the base substrate 01 is in direct contact with the unitary electrode.

In some embodiments, referring to FIG. 1A and FIG. 1B, the array substrate 02 includes a plurality of light emitting elements 201 respectively in the plurality of subpixels SP. Optionally, when the counter substrate 01 and the array substrate 02 are assembled together into a cell to form the display apparatus, an orthographic projection of the respective one of the light emitting elements 201 on the counter substrate 01 covers an orthographic projection of the respective one of the plurality of photosensors 101 on the counter substrate 01. Optionally, referring to FIG. 1A, FIG. 2A, and FIG. 2B, the side of the second electrode 12 of the respective one of the plurality of photosensors 101 away from the base substrate 10 is facing the respective one of the plurality of light emitting elements 201.

Optionally, the plurality of light emitting elements 201 include a first light emitting element B emitting light in blue color, a second light emitting element G emitting light in green color, and a third light emitting element R emitting light in red color. Optionally, the plurality of photosensors 101 includes a first photosensor 101B corresponding to the first light emitting element B, a second photosensor 101G corresponding to the second light emitting elements G, and a third photosensor 101R corresponding to the third light emitting elements R.

For example, a light detecting unit of the first photosensor 101B receives light L1 emitted from the first light emitting element B and detects light emitting brightness values of the first light emitting element B. By disposing a light shielding wall on the lateral side of the light detecting unit of the first photosensor 101B closer to the second light emitting element G, the light L2 emitted from the second light emitting element G is shielded from transmitting to the light detecting unit of the first photosensor 101B, which may prevent the light emitted from adjacent subpixels from affecting the result of light brightness value detection.

As used herein, the term "covers" refers to an entirety of an orthographic projection A is completely overlapped by a portion or an entirety of an orthographic projection B. Optionally, an orthographic projection of the first light emitting elements B on the counter substrate 01 covers an orthographic projection of the first photosensor 101B on the counter substrate 01, an entirety of the orthographic projection of the first photosensor 101B is completely overlapped by a portion or an entirety of the orthographic projection of the first light emitting elements B. Optionally, an orthographic projection of the second light emitting element G on the counter substrate 01 covers an orthographic projection of the second photosensor 101G on the counter substrate 01, an entirety of the orthographic projection of the second photosensor 101G is completely overlapped by a portion or an entirety of the orthographic projection of the second light emitting element G. Optionally, an orthographic projection of the third light emitting element R on the counter substrate 01 covers an orthographic projection of the third photosensor 101R on the counter substrate 01, an entirety of the orthographic projection of the third photosensor 101R is completely overlapped by a portion or an entirety of the orthographic projection of the third light emitting element R.

In some embodiments, the respective one of the plurality of light emitting elements 201 has a substantially rectangular shape. Optionally, the orthographic projection of the respective one of the plurality of photosensors 101 on the array substrate 02 at least partially covers one of corners of the respective one of the plurality of light emitting elements 201, which may prevent the light emitted from the respective one of the plurality of light emitting elements 201 from being shielded by the respective one of the plurality of photosensors 101.

In some embodiments, the plurality of light emitting elements 201 respectively include a plurality of organic light emitting diodes. Optionally, the plurality of light emitting elements 201 respectively include a plurality of quantum dot light emitting diodes. Optionally, the plurality of light emitting elements 201 respectively include a plurality of micro light emitting diodes.

Examples of appropriate display apparatuses described herein include, but are not limited to, an electronic paper, a mobile phone, a tablet computer, a television, a monitor, a notebook computer, a digital album, a GPS, etc.

In some embodiments, the respective one of the plurality of light shielding walls 102 can shield at least one lateral side of the respective one of the plurality of photosensors from light emitted from adjacent subpixels, which may improve an accuracy of a light emitting brightness values of the respective one of the plurality of subpixels detected by the respective one of the plurality of photosensors, and further improve a result of a brightness compensation.

In some embodiments, the optical compensation device convert light signals into electrical signals, and the plurality of thin film transistors reads the electrical signals. Optionally, the optical compensation device includes the plurality of the thin film transistors.

FIG. 3A is a circuit diagram of a respective one of the plurality of photosensors in some embodiments according to the present disclosure. Referring to FIG. 2A, FIG. 2B and FIG. 3A, the respective one of the plurality of photosensors 101 in some embodiments includes a light detecting unit 13 electrically connected to a respective one of the plurality of thin film transistors TFT. The source electrode S of the respective one of the plurality of thin film transistors TFT is electrically connected to first electrode 11, and the first electrode 11 is electrically connected to the light detecting unit 13. The drain electrode D of the respective one of the plurality of thin film transistors TFT is electrically connected to a read line R, which may in turn further connects to other components of the respective one of the plurality of photosensors 101. The other terminal of the light detecting unit 13 is connected to a second electrode 12, which may be a common electrode configured to be provided with a common voltage (e.g., a ground voltage).

Various appropriate light detecting unit may be utilized in making and using the present photosensor. Examples of light detecting unit include, but are not limited to, a PN photodiode, a PIN photodiode, an avalanche photodiode, a MIM diode junction, a MIS diode junction, a MOS diode junction, a SIS diode junction, and a MS diode junction.

FIG. 3B is a schematic diagram illustrating the structure of a respective one of the plurality of photosensors in some embodiments according to the present disclosure. Referring to FIG. 3B, in some embodiments, the light detecting unit 13 of the respective one of the plurality of photosensors is a PIN photodiode. In some embodiments, the light detecting unit 13 includes a first polarity semiconductor layer 131 electrically connected to the second electrode 12; a second polarity semiconductor layer 133 electrically connected to the first electrode 11, which in turn is electrically connected to the source electrode S of the respective one of the plurality of thin film transistors TFT; and an intrinsic semiconductor layer 132 connecting the first polarity semiconductor layer 131 and the second polarity semiconductor layer 133. As used herein, the term intrinsic semiconductor layer refers to a layer that can exhibit current rectification, e.g., a layer that exhibits drastically different conductivities in one bias direction relative to the other.

Optionally, the respective one of the plurality of photosensors 101 having a light detecting unit 13 includes a first polarity semiconductor layer 131 having a first dopant, a second polarity semiconductor layer 133 having a second dopant, and an intrinsic semiconductor layer 132 connecting the polarity semiconductor layer and the second polarity semiconductor layer 133. For example, the first dopant is P-type dopant such as a Group IIIA element of the Periodic Table of the Elements including boron (B), aluminum (Al), gallium (Ga), indium (In), and thallium (Tl), and the second dopant is N-type dopant such as a Group VA element of the Periodic Table of the Elements including nitrogen (N), phosphorous (P), arsenic (As), antimony (Sb), and bismuth (Bi). Optionally, the respective one of the plurality of photosensors 101 having the light detecting unit 13 is reversely biased when the first polarity semiconductor layer 131 is connected to a low voltage and the second polarity semiconductor layer 133 is connected to a high voltage. For example, the respective one of the plurality of photosensors 101 having a light detecting unit 13 is in a reversely biased state when the first polarity semiconductor layer 131 is connected to a common electrode (low voltage, e.g., −5 V to 0 V). In some embodiments, the respective one of the plurality of photosensors 101 having a light detecting unit 13 is a PN junction having a P+ doping semiconductor region as the first polarity semiconductor layer 131 and an N+ doping semiconductor region as the second polarity semiconductor layer 133. In some embodiments, the respective one of the plurality of photosensors 101 having a light detecting unit 13 is a PIN photodiode having a P+ doping semiconductor region as the first polarity semiconductor layer 131, an N+ doping semiconductor region as the second polarity semiconductor layer 133, and an intrinsic semiconductor layer 132 of amorphous silicon between the P+ doping semiconductor region and the N+ doping semiconductor region.

In some embodiments, referring to FIG. 2A and FIG. 2B, the respective one of the plurality of light shielding walls 102 is on the lateral side of the light detecting unit 13 of the respective one of the plurality of photosensors 101. Optionally, the respective one of the plurality of light shielding walls 102 substantially surrounds at least a portion of a perimeter of the light detecting unit 13 of the respective one of the plurality of photosensors 101.

FIG. 4 is a schematic diagram of a structure of a counter substrate in some embodiments according to the present disclosure. Referring to FIG. 4, in some embodiments, the respective one of the plurality of light shielding walls 102 substantially surrounds a perimeter of the light detecting unit 13 of the respective one of the plurality of photosensors 101. For example, the respective one of the plurality of light shielding walls 102 substantially surrounds four lateral sides of the respective one of the plurality of photosensors 101, which may greatly reduce the effect of light emitted from adjacent subpixels on the respective one of the plurality of photosensors 101.

As used herein the term "substantially surround" refers to surround at least 50% (e.g., at least 60%, at least 70%, at least 80%, at least 90%, at least 95%, at least 99%, and 100%) of a perimeter of an area. For example, the respective one of the plurality of light shielding walls 102 surrounds at least 60% of the perimeter of the light detecting unit 13 of the respective one of the plurality of photosensors 101.

In some embodiments, the respective one of the plurality of light shielding walls 102 substantially surrounds an area in the counter substrate 01 corresponding to a respective one of the plurality of subpixels SP.

Various appropriate materials may be used for making the plurality of light shielding walls 102. Examples of materials suitable for making the plurality of light shielding walls 102 includes, but are not limited to, black light absorbing materials.

Optionally, the plurality of light shielding walls 102 includes a black resin material. Optionally, the respective one of the plurality of light shielding walls 102 is in direct contact with the light detecting unit 13 of the respective one of the plurality of photosensors 101 or the second electrode 12.

Optionally, the plurality of light shielding walls 102 includes a metal material; and a respective one of the plurality of light shielding walls 102 is configured to reflect light emitted from the respective one of the subpixels SP to the respective one of the plurality of photosensors 101. For example, the metal material is one or a combination of titanium, aluminum, copper, nickel, chromium.

When the plurality of light shielding walls 102 include conductive metal materials, in order to avoid a short circuit between the respective one of the plurality of light shielding walls 102, the light detecting unit 13 of the respective one of the plurality of photosensors 101, and the second electrode 12 of the respective one of the plurality of photosensors 101, the respective one of the plurality of light shielding walls 102 is spaced apart from the light detecting unit 13 of the respective one of the plurality of photosensors 101 and the second electrode 12.

When the plurality of light shielding walls 102 include conductive metal materials, in order to prevent the plurality of light shielding walls 102 from reflecting ambient light and affecting display quality of the display apparatus, optionally, a polarizer can be disposed on a side of the respective one of the plurality of light shielding walls 102 away from the array substrate 01. Optionally, a black light absorbing layer can be disposed on the side of the respective one of the plurality of light shielding walls 102 away from the array substrate 01. Optionally, referring to FIG. 2A and FIG. 2B, the respective one of the plurality of light shielding walls 102 can extend through the black matrix BM.

In some embodiments, referring to FIG. 2A and FIG. 2B, a relative height H1 of a side of the respective one of the plurality of light shielding walls 102 away from the base substrate 10 with respect to the base substrate 01 is greater than a relative height H2 of a side of the second electrode 12 of the respective one of the plurality of photosensors 101 away from the base substrate 10 with respect to the base substrate 10.

Optionally, a relative height ΔH of the side of the respective one of the plurality of light shielding walls 102 away from the base substrate 10 with respect to the side of the second electrode 12 of the respective one of the plurality of photosensors 101 away from the base substrate 10 is in a range of 2 μm to 20 μm, e.g., 2 μm to 5 μm, 5 μm to 10 μm, 10 μm to 15 μm, and 15 μm to 20 μm. In one example, when the relative height ΔH is equivalent to or greater than 2 μm, the respective one of the plurality of light shielding walls 102 can effectively shielding light emitted from adjacent subpixels from transmitting to the respective one of the plurality of photosensors 101. In another example, when the relative height ΔH is equivalent to or less than 20 μm, a thickness of the counter substrate 01 will not be too thick due to the relative height ΔH.

In some embodiments, the relative height H1 of the side of the respective one of the plurality of light shielding walls 102 away from the base substrate 10 with respect to the base substrate is greater than a relative height H3 of a side of a black matrix BM away from the base substrate 10 with respect to the base substrate 10.

In another aspect, the present disclosure also provides a counter substrate of a display apparatus having a plurality of subpixels and an inter-subpixel region. In some embodiment, the counter substrate 01 is the counter substrate in the display apparatus described herein.

In some embodiments, referring to FIG. 1A, FIG. 2A and FIG. 2B, the counter substrate 01 includes a base substrate 10; a plurality of photosensors 101 on the base substrate 01 configured to respectively detect light emitting brightness values of the plurality of subpixels SP; a plurality of light shielding walls 102 on the base substrate 10. Optionally, a respective one of the plurality of light shielding walls 102 is configured to at least partially shield a lateral side of a respective one of the plurality of photosensors 101 from light emitted from adjacent subpixels. Optionally, the plurality of light shielding walls 102 are in the inter-subpixel region ISR.

In some embodiments, a respective one of the plurality of photosensors 101 includes a first electrode 11 on the base substrate 10; a light detecting unit 13 on a side of the first electrode 11 away from the base substrate 10; and a second electrode 12 on a side of the light detecting unit 13 away from the first electrode 11. Optionally, the second electrode 12 is substantially transparent. Optionally, the respective one of the plurality of light shielding walls 102 is configured to at least partially shield a lateral side of the light detecting unit 13 of the respective one of the plurality of photosensors 101 from light emitted from the adjacent subpixels. Optionally, a side of the respective one of the plurality of light shielding walls 102 closer to the base substrate 10 is in direct contact with the first electrode 11 of the respective one of the plurality of photosensors 101.

In some embodiments, the counter substrate 01 further includes a plurality of thin film transistors TFT on the base substrate 10 and respectively in the plurality of subpixels SP. Optionally, a respective one of the plurality of thin film transistors TFT includes a source electrode S, a drain electrode D, and a gate electrode G. Optionally, the first electrode 11 is electrically connected to the source electrode S.

In some embodiments, the first electrode 11 and the source electrode S are parts of a unitary electrode. Optionally, the side of the respective one of the plurality of light shielding walls 102 closer to the base substrate 10 is in direct contact with the unitary electrode.

In some embodiments, a relative height H1 of a side of the respective one of the plurality of light shielding walls 102 away from the base substrate 10 with respect to the base substrate 10 is greater than a relative height H2 of a side of the second electrode 12 of the respective one of the plurality of photosensors 101 away from the base substrate 10 with respect to the base substrate 10.

In some embodiments, a relative height ΔH of the side of the respective one of the plurality of light shielding walls 102 away from the base substrate 10 with respect to the side of the second electrode 12 of the respective one of the plurality of photosensors 101 away from the base substrate 10 is in a range of 2 μm to 20 μm, e.g., 2 μm to 5 μm, 5 μm to 10 μm, 10 μm to 15 μm, and 15 μm to 20 μm.

In some embodiments, the plurality of light shielding walls 102 includes a metal material. A respective one of the plurality of light shielding walls 102 is configured to reflect light emitted from a respective one of the subpixels to the respective one of the plurality of photosensors 101. Optionally, the plurality of light shielding walls includes a black resin material.

In some embodiments, the respective one of the plurality of light shielding walls 102 substantially surrounds an area in the counter substrate 01 corresponding to a respective one of the plurality of subpixels SP. Optionally, the respective one of the plurality of light shielding walls 102 substantially surrounds a perimeter of the detecting unit of the respective one of the plurality of photosensors 101.

In some embodiments, the light detecting unit 13 of the respective one of the plurality of photosensors 101 is a PIN photodiode.

Figure 5:
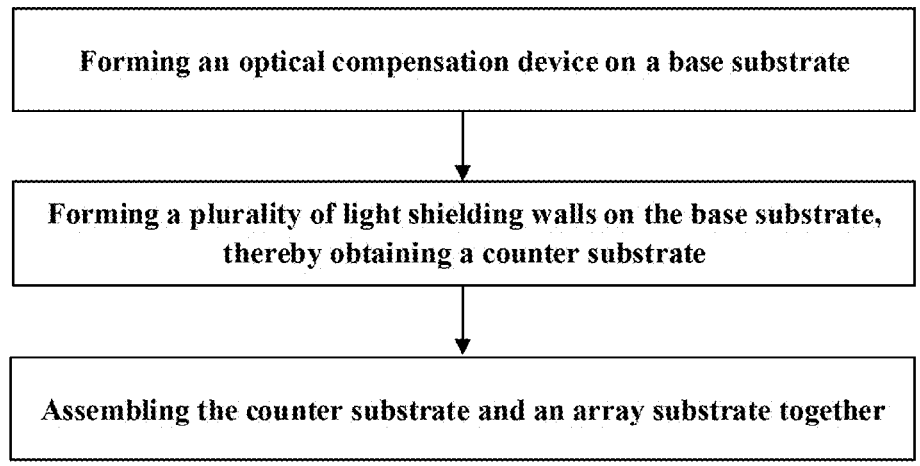
FIG. 5 is a flow chart illustrating a method of fabricating a display apparatus in some embodiments according to the present disclosure.

In another aspect, the present disclosure also provides a method of fabricating a display apparatus having a plurality of subpixels. FIG. 5 is a flow chart illustrating a method of fabricating a display apparatus in some embodiments according to the present disclosure. In some embodiments, referring to FIG. 5, the method includes forming an optical compensation device on a base substrate; forming a plurality of light shielding walls on the base substrate; thereby obtaining a counter substrate; assembling the counter substrate and an array substrate together. Optionally, the optical compensation device is formed to includes a plurality of photosensors configured to respectively detect light emitting brightness values of the plurality of subpixels; and a respective one of the plurality of light shielding walls configured to at least partially shield a lateral side of a respective one of the plurality of photosensors from light emitted from adjacent subpixels. Optionally, a respective one of the plurality of photosensors includes a first electrode on the base substrate; a light detecting unit on a side of the first electrode away from the base substrate; and a second electrode, which is substantially transparent, on a side of the light detecting unit away from the first electrode.

In some embodiments, forming a respective one of the plurality of light shielding walls includes forming the first electrode of the respective one of the plurality of photosensors on the base substrate; forming a photoresist layer on a side of the first electrode of the respective one of the plurality of photosensors away from the base substrate; patterning the photoresist layer to form a via extending through the photoresist layer; forming the respective one of the plurality of light shielding walls in the via using an electroforming process; and removing the photoresist layer.

Figure 6:
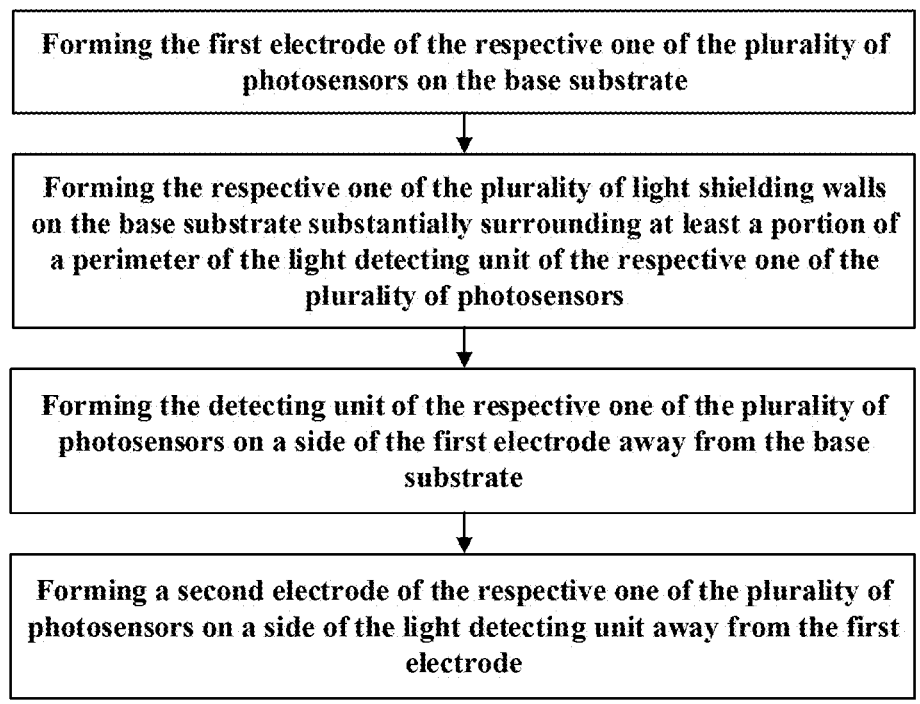
FIG. 6 is a flow chart illustrating a method of fabricating a counter substrate in some embodiments according to the present disclosure.

FIG. 6 is a flow chart illustrating a method of fabricating a counter substrate in some embodiments according to the present disclosure. Referring to FIG. 6, in some embodiments, forming the counter substrate includes forming the first electrode of the respective one of the plurality of photosensors on the base substrate; forming the respective one of the plurality of light shielding walls on the base substrate substantially surrounding at least a portion of a perimeter of the light detecting unit of the respective one of the plurality of photosensors; forming the detecting unit of the respective one of the plurality of photosensors on a side of the first electrode away from the base substrate; and forming a second electrode of the respective one of the plurality of photosensors on a side of the light detecting unit away from the first electrode.

Figure 7:
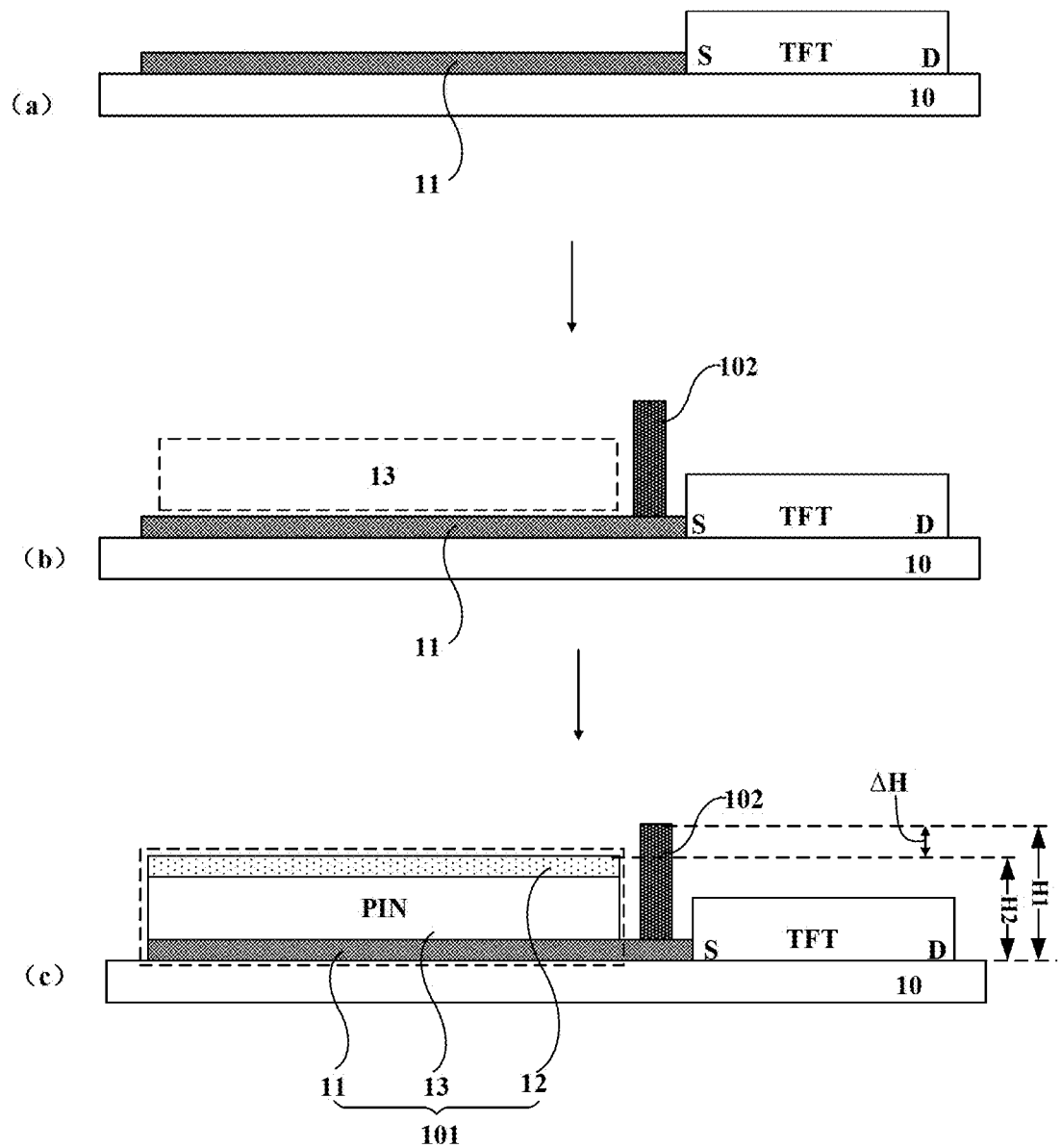
FIG. 7 is a schematic diagram illustrating a method of fabricating a counter substrate in some embodiments according to the present disclosure.

FIG. 7 is a schematic diagram illustrating a method of fabricating a counter substrate in some embodiments according to the present disclosure. Referring to FIG. 7 (a), the first electrode 11 of the respective one of the plurality of photosensors is formed on the base substrate 10 using a patterning process. Optionally, a source electrode S of the respective one of the plurality of thin film transistors TFT and the first electrode 11 are formed in the same patterning process and in a same layer.

Referring to FIG. 7 (b), in some embodiments, the respective one of the plurality of light shielding walls 102 is formed on the base substrate 10 substantially surrounding at least a portion of a perimeter of the light detecting unit 13 of the respective one of the plurality of photosensors. Optionally, prior to forming the light detecting unit 13, the respective one of the plurality of light shielding walls 102 is formed on the base substrate 10 substantially surrounding a region corresponding to the light detecting unit 13. Optionally, subsequent to forming the light detecting unit 13, the respective one of the plurality of light shielding walls 102 is formed on the base substrate 10 substantially surrounding the portion of the perimeter of the light detecting unit 13 of the respective one of the plurality of photosensors 101.

Referring to FIG. 7 (c), in some embodiments, the light detecting unit 13 of the respective one of the plurality of photosensors 101 is formed on a side of the first electrode 11 away from the base substrate 10 using a patterning process. Optionally, subsequent to forming the light detecting unit 13, a second electrode 12 of the respective one of the plurality of photosensors 101 is formed on a side of the light detecting unit 13 away from the first electrode 11.

Optionally, the second electrode 12 is a substantially transparent electrode. Optionally, the relative height H1 of a side of the respective one of the plurality of light shielding walls 102 away from the base substrate 10 with respect to the base substrate 10 is greater than a relative height H2 of a side of the second electrode 12 of the respective one of the plurality of photosensors 101 away from the base substrate 10 with respect to the base substrate 10.

Optionally, a relative height ΔH of the side of the respective one of the plurality of light shielding walls 102 away from the base substrate 10 with respect to the side of the second electrode 12 of the respective one of the plurality of photosensors 101 away from the base substrate 10 is in a range of 2 μm to 20 μm, e.g., 2 μm to 5 μm, 5 μm to 10 μm, 10 μm to 15 μm, and 15 μm to 20 μm.

Optionally, subsequent to forming the second electrode 12 of the respective one of the plurality of photosensors 101, various appropriate layers may be formed on a side of the second electrode 12 away from the base substrate 10. For example, a planarization layer is formed on the side of the second electrode 12 away from the base substrate 10.

Optionally, the patterning process described is one or a combination of a lithography process, a printing process, and an inkjet printing process. Various method may be included in the lithography process for patterning. Examples of methods in the lithography process include, but are not limited to, coating photoresist, exposing, developing, etching, and stripping the photoresist.

Figure 8:
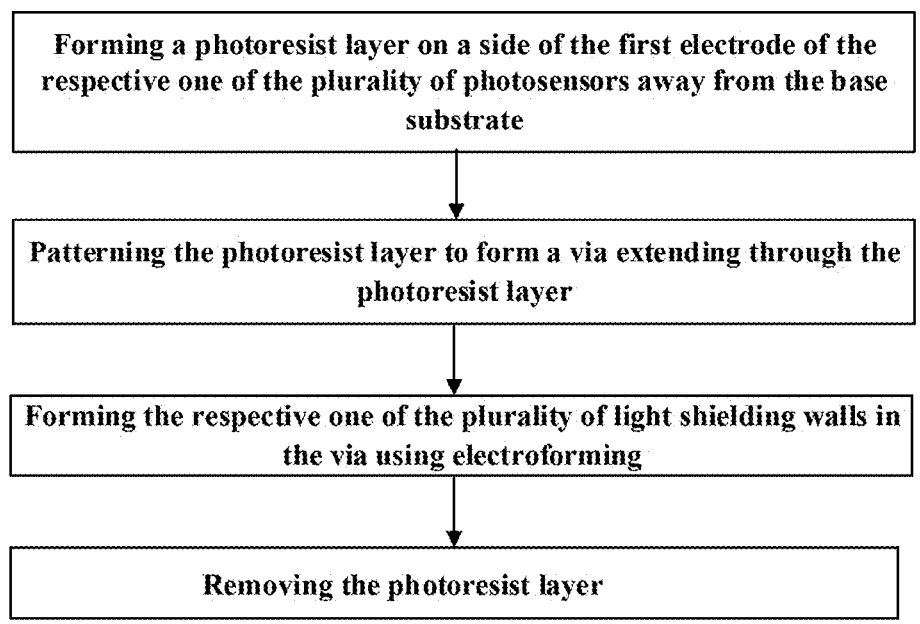
FIG. 8 is a flow chart illustrating a method of fabricating a plurality of light shielding walls in some embodiments according to the present disclosure.

FIG. 8 is a flow chart illustrating a method of fabricating a plurality of light shielding walls in some embodiments according to the present disclosure. Referring to FIG. 8, in some embodiments, forming the plurality of light shielding walls includes forming a photoresist layer on a side of the first electrode of the respective one of the plurality of photosensors away from the base substrate; patterning the photoresist layer to form a via extending through the photoresist layer; forming the respective one of the plurality of light shielding walls in the via using an electroforming process; removing the photoresist layer.

In some embodiments, forming the respective one of the plurality of light shielding walls includes forming a metal layer on a side of the first electrode using a sputtering process, and patterning the metal layer to form a plurality of light shielding walls.

Figure 9:
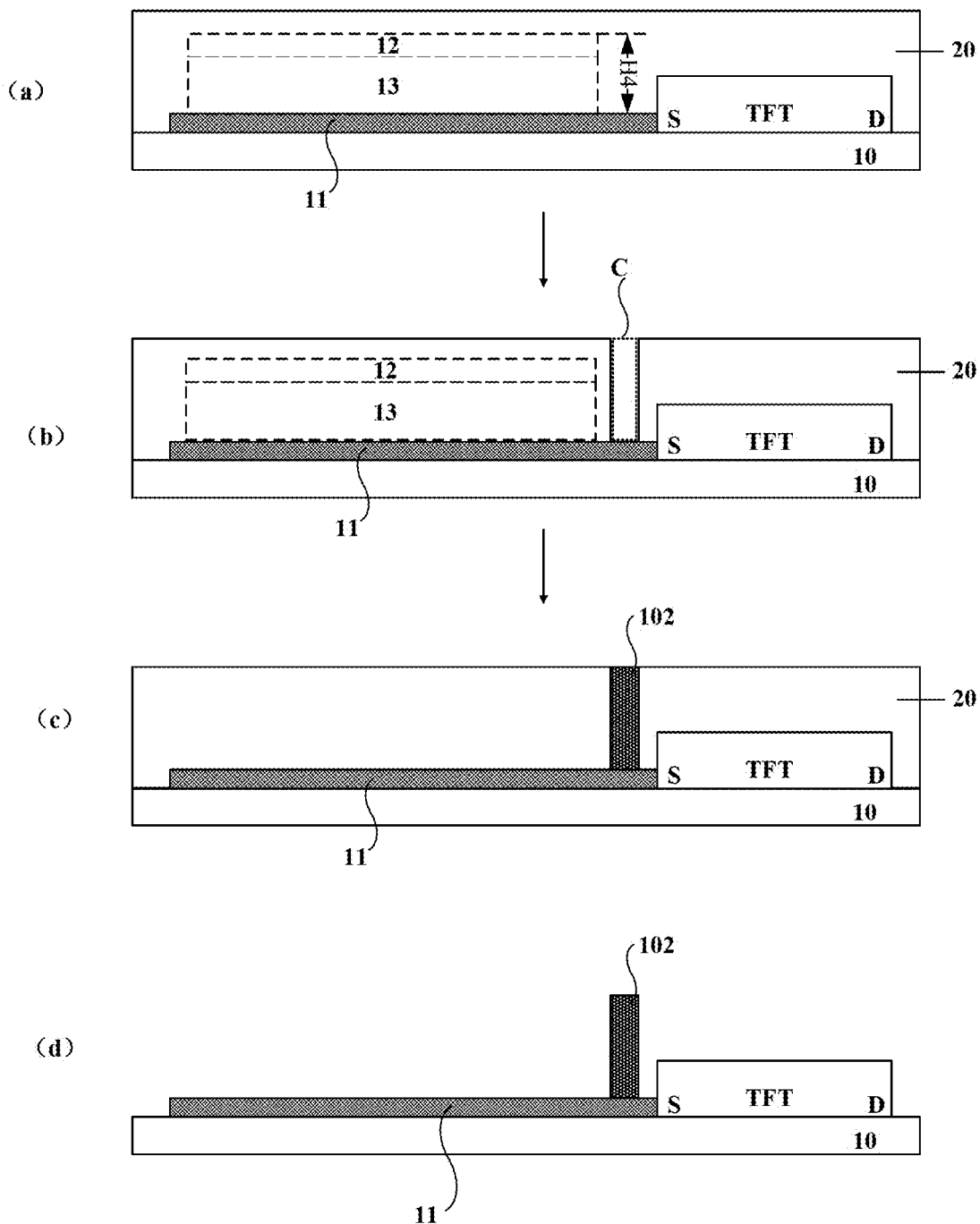
FIG. 9 is a schematic diagram illustrating a method of fabricating a plurality of light shielding walls in some embodiments according to the present disclosure.

FIG. 9 is a schematic diagram illustrating a method of fabricating a plurality of light shielding walls in some embodiments according to the present disclosure. Referring to FIG. 9 (a), in some embodiments, the photoresist layer 20 is formed on a side of the first electrode 11 of the respective one of the plurality of photosensors away from the base substrate 10.

Optionally, a thickness of the photoresist layer 20 is greater than a relative height H4 of the side of the second electrode 12 away from the base substrate 10 with respect to a surface of the first electrode 11 away from the base substrate 10. For example, the thickness of the photoresist layer 20 is greater than a sum of a thickness of the second electrode 12 and a thickness of the light detecting unit 13.

Optionally, the photoresist layer 20 is made of a negative photoresist material. Optionally, negative photoresist materials include SU-8 negative photoresist material.

In some embodiments, referring to FIG. 9 (b), the photoresist layer is patterned to form a via C extending through the photoresist layer 20. For example, the via C substantially surrounds the perimeter of a regions corresponding to the light detecting unit 13 of the respective one of the plurality of photosensors. Optionally, the via C exposes a portion of a surface of the first electrode 11. Optionally, the via C exposes a portion of a surface of a unitary electrode including the first electrode 11 and the source electrode S of the respective one of the plurality of thin film transistors.

In some embodiments, referring to FIG. 9 (c), the respective one of the plurality of light shielding walls 102 is formed in the via C using an electroforming process. Using the electroforming processing can form the respective one of the plurality of light shielding walls 102 only in the via C, which can save a lot of conductive materials used for making the plurality of the light shielding walls 102, and avoid much press applied on the base substrate in an etching process used to etch a conductive material layer to form the plurality of light shielding walls 102.

For example, the base substrate 10 in the FIG. 9 (b) is put in a salt solution having copper ions, an anode is a copper electrode, a cathode is the first electrode 11 on the base substrate 10, when a direct current is applied, the copper ions deposit in the via C. Subsequent to forming the plurality of copper light shielding walls, the base substrate 10 is taken out of the salt solution having copper ions, e.g. a height of the respective one of the plurality of light shielding walls 102 is greater than the sum of the thickness of the second electrode 12 and the thickness of the light detecting unit 13.

In some embodiments, referring to FIG. 9 (d), the photoresist layer 20 is removed.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus having a plurality of subpixels, comprising:
    an array substrate and a counter substrate facing the array substrate;
    wherein the counter substrate comprises a base substrate;
    an optical compensation device on the base substrate configured to adjust light emitting brightness values of the plurality of subpixels to target brightness values respectively, the optical compensation device comprising a plurality of photosensors configured to respectively detect light emitting brightness values of the plurality of subpixels; and
    a plurality of light shielding walls on the base substrate;
    wherein a respective one of the plurality of light shielding walls is configured to at least partially shield a lateral side of a respective one of the plurality of photosensors from light emitted from adjacent subpixels;
    wherein a respective one of the plurality of photosensors comprises:
    a first electrode on the base substrate;
    a light detecting unit on a side of the first electrode away from the base substrate; and
    a second electrode, which is substantially transparent, on a side of the light detecting unit away from the first electrode;
    wherein the respective one of the plurality of light shielding walls is configured to at least partially shield a lateral side of the light detecting unit of the respective one of the plurality of photosensors from light emitted from the adjacent subpixels; and
    a side of the respective one of the plurality of light shielding walls closer to the base substrate is in direct contact with the first electrode of the respective one of the plurality of photosensors.

2. The display apparatus of claim 1, wherein the counter substrate further comprises a plurality of thin film transistors on the base substrate and respectively in the plurality of subpixels;
    a respective one of the plurality of thin film transistors comprises a source electrode; and
    the first electrode is electrically connected to the source electrode.

3. The display apparatus of claim 1, wherein the first electrode and the source electrode are parts of a unitary electrode; and
    the side of the respective one of the plurality of light shielding walls closer to the base substrate is in direct contact with the unitary electrode.

4. The display apparatus of claim 1, wherein a relative height of a side of the respective one of the plurality of light shielding walls away from the base substrate with respect to the base substrate is greater than a relative height of a side of the second electrode of the respective one of the plurality of photosensors away from the base substrate with respect to the base substrate.

5. The display apparatus of claim 1, wherein a relative height of the side of the respective one of the plurality of light shielding walls away from the base substrate with respect to the side of the second electrode of the respective one of the plurality of photosensors away from the base substrate is in a range of 2 µm to 20 µm.

6. The display apparatus of claim 1, wherein the array substrate comprises a plurality of light emitting elements respectively in the plurality of subpixels;
    an orthographic projection of the respective one of the light emitting elements on the counter substrate covers an orthographic projection of the respective one of the plurality of photosensors on the counter substrate; and
    the side of the second electrode of the respective one of the plurality of photosensors away from the base substrate is facing the respective one of the plurality of light emitting elements.

7. The display apparatus of claim 1, wherein the plurality of light shielding walls comprises a metal material; and
    a respective one of the plurality of light shieling walls is configured to reflect light emitted from a respective one of the subpixels to the respective one of the plurality of photosensors.

8. The display apparatus of claim 1, wherein the plurality of light shielding walls comprises a black resin material.

9. The display apparatus of claim 1, wherein the respective one of the plurality of light shielding walls substantially surrounds an area in the counter substrate corresponding to a respective one of the plurality of subpixels.

10. The display apparatus of claim 1, wherein the respective one of the plurality of light shielding walls substantially surrounds a perimeter of the light detecting unit of the respective one of the plurality of photosensors; and transistors are outside an area surrounded by the respective one of the plurality of light shielding walls.

11. The display apparatus of claim 1, wherein the light detecting unit of the respective one of the plurality of photosensors is a PIN photodiode.

12. The display apparatus of claim 1, wherein the respective one of the plurality of light shielding walls is configured to completely shield the lateral side of the respective one of the plurality of photosensors from light emitted from adjacent subpixels.

13. A counter substrate of a display apparatus having a plurality of subpixels, comprising:
    a base substrate;
    a plurality of photosensors on the base substrate configured to respectively detect light emitting brightness values of the plurality of subpixels; and
    a plurality of light shielding walls on the base substrate;
    wherein a respective one of the plurality of light shielding walls is configured to at least partially shield a lateral side of a respective one of the plurality of photosensors from light emitted from adjacent subpixels;
    wherein a respective one of the plurality of photosensors comprises:
    a first electrode on the base substrate;
    a light detecting unit on a side of the first electrode away from the base substrate; and
    a second electrode, which is substantially transparent, on a side of the light detecting unit away from the first electrode;
    wherein the respective one of the plurality of light shielding walls is configured to at least partially shield a lateral side of the light detecting unit of the respective one of the plurality of photosensors from light emitted from the adjacent subpixels; and
    a side of the respective one of the plurality of light shielding walls closer to the base substrate is in direct contact with the first electrode of the respective one of the plurality of photosensors.

14. The counter substrate of claim 13, wherein the counter substrate further comprises a plurality of thin film transistors on the base substrate and respectively in the plurality of subpixels;
    a respective one of the plurality of thin film transistors comprises a source electrode; and
    the first electrode is electrically connected to the source electrode.

15. The counter substrate of claim 13, wherein the first electrode and the source electrode are parts of a unitary electrode; and
    the side of the respective one of the plurality of light shielding walls closer to the base substrate is in direct contact with the unitary electrode.

16. The counter substrate of claim 13, wherein a relative height of a side of the respective one of the plurality of light shielding walls away from the base substrate with respect to the base substrate is greater than a relative height of a side of the second electrode of the respective one of the plurality of photosensors away from the base substrate with respect to the base substrate.

17. A method of fabricating a display apparatus having a plurality of subpixels, comprising:
    forming an optical compensation device on a base substrate;
    forming a plurality of light shielding walls on the base substrate, thereby obtaining a counter substrate;
    assembling the counter substrate and an array substrate together;
    wherein the optical compensation device is formed to comprises a plurality of photosensors configured to respectively detect light emitting brightness values of the plurality of subpixels; and
    a respective one of the plurality of light shielding walls configured to at least partially shield a lateral side of a respective one of the plurality of photosensors from light emitted from adjacent subpixels;
    wherein forming a respective one of the plurality of photosensors comprises:
    forming a first electrode on the base substrate;
    forming a light detecting unit on a side of the first electrode away from the base substrate; and
    forming a second electrode, which is substantially transparent, on a side of the light detecting unit away from the first electrode;
    wherein the respective one of the plurality of light shielding walls is configured to at least partially shield a lateral side of the light detecting unit of the respective one of the plurality of photosensors from light emitted from the adjacent subpixels; and
    a side of the respective one of the plurality of light shielding walls closer to the base substrate is in direct contact with the first electrode of the respective one of the plurality of photosensors.

18. The method of claim 17, wherein forming a respective one of the plurality of light shielding walls comprises forming a first electrode of the respective one of the plurality of photosensors on the base substrate;
    forming a photoresist layer on a side of the first electrode of the respective one of the plurality of photosensors away from the base substrate;
    patterning the photoresist layer to form a via extending through the photoresist layer;
    forming the respective one of the plurality of light shielding walls in the via using an electroforming process; and
    removing the photoresist layer.

* * * * *